(12) United States Patent
Komuro et al.

(10) Patent No.: US 6,977,563 B2
(45) Date of Patent: Dec. 20, 2005

(54) THIN-FILM PIEZOELECTRIC RESONATOR AND METHOD FOR FABRICATING THE SAME

(75) Inventors: Eiju Komuro, Tokyo (JP); Masaaki Imura, Tokyo (JP); Katsuhiko Gunji, Tokyo (JP); Taku Takeishi, Tokyo (JP); Roger William Whatmore, Milton Keynes (GB); Joseph Edward Albert Southin, Bedfordshire (GB)

(73) Assignee: TDK Corporation, Tokyo (JP)

( * ) Notice: Subject to any disclaimer, the term of this patent is extended or adjusted under 35 U.S.C. 154(b) by 54 days.

(21) Appl. No.: 10/670,234

(22) Filed: Sep. 26, 2003

(65) Prior Publication Data

US 2004/0140865 A1 Jul. 22, 2004

(30) Foreign Application Priority Data

Sep. 27, 2002 (JP) .................................... 2002-282727

(51) Int. Cl.[7] .............................................. H03H 9/00
(52) U.S. Cl. ..................................... 333/187; 333/189
(58) Field of Search ................................ 333/187, 188, 333/189, 191; 310/312, 321

(56) References Cited

U.S. PATENT DOCUMENTS

| | | | |
|---|---|---|---|
| 4,320,365 A | | 3/1982 | Black et al. ............... 333/187 |
| 6,842,088 B2 | | 12/2002 | Yamada et al. |
| 6,509,813 B2 | * | 1/2003 | Ella et al. .................. 333/187 |
| 6,601,276 B2 | * | 8/2003 | Barber .................... 29/25.35 |
| 6,657,517 B2 | * | 12/2003 | Barber et al. ............. 333/187 |
| 6,674,291 B1 | * | 1/2004 | Barber et al. ............. 324/520 |
| 6,734,763 B2 | * | 5/2004 | Nishihara et al. .......... 333/187 |
| 6,767,749 B2 | * | 7/2004 | Kub et al. ..................... 438/3 |
| 6,774,746 B2 | * | 8/2004 | Whatmore et al. ......... 333/189 |

FOREIGN PATENT DOCUMENTS

| | | |
|---|---|---|
| JP | 60-189307 | 9/1985 |
| JP | 2000-278078 | 10/2000 |
| WO | WO 99/37023 | 7/1999 |

OTHER PUBLICATIONS

Kiyoshi Nakamura, et al., "Thin Film Resonators and Filters", International Symposium on Acoustic Wave Devices for Future Mobile Communication Systems, pp. 93–99, Mar. 5, 2001.

Su Q.X, et al., Edge Supported ZnO Thin Film Bulk Acoustic Wave Resonators and Filter Design, Frequency Control Symposium and Exhibition, 2000 Proceedings of the 2000 IEEE/EIA International Jun. 7–9, 2000, pp. 434–440.

* cited by examiner

Primary Examiner—Dean Takaoka
(74) Attorney, Agent, or Firm—Oblon, Spivak, McClelland, Maier & Neustadt, P.C.

(57) ABSTRACT

A thin-film piezoelectric resonator including a piezoelectric thin film having piezoelectric characteristic, and an upper electrode and a lower electrode arranged on opposite surfaces of the piezoelectric thin film for applying an excitation voltage to the piezoelectric thin film, wherein: each of the upper electrode and the lower electrode includes a resonant portion, and a lead-out portion; and the electrode thickness of at least one part of the lead-out portion in at least one of the upper electrode and the lower electrode is larger than the electrode thickness of the resonant portion formed to be continued from the lead-out portion.

7 Claims, 9 Drawing Sheets

ALUMINUM (Al) ELECTRODES

GOLD (Au) ELECTRODES

THIN-FILM PIEZOELECTRIC RESONATOR AND METHOD FOR FABRICATING THE SAME

BACKGROUND OF THE INVENTION

The present invention relates to a thin-film piezoelectric resonator, a filter and a duplexer including such piezoelectric resonators, and a method for producing the thin-film piezoelectric resonator.

In mobile communication apparatuses such as cellular phones which have come into wide use recently, both reduction in size and heightening in operating frequency have advanced year by year. Therefore, both reduction in size and heightening in operating frequency have been required in electronic parts used in such mobile communication apparatuses.

Some mobile communication apparatuses have a duplexer for performing switching between a transmit signal path and a receive signal path in order to use one antenna for both transmission and reception. The duplexer has a transmit filter capable of passing a transmit signal but cutting off a receive signal, and a receive filter capable of passing a receive signal but cutting off a transmit signal.

Surface acoustic wave filters have been used as the filters in the duplexer recently. Such a surface acoustic wave filter has features that the filter can support frequencies up to 2 GHz, and that the size of the filter can be reduced as compared with a ceramic filter. In the present circumstances, however, there still remain a lot of technical problems in order to apply the surface acoustic wave filter to frequencies of not lower than 2 GHz at which the mobile communication apparatuses will work in the future.

Therefore, a device called thin film bulk acoustic resonator (hereinafter referred to as FBAR) has attracted public attention recently, for example, as described in JP-A-2000-278078. The FBAR is a thin-film piezoelectric resonator using resonance in a direction of the thickness of a piezoelectric thin film. In the FBAR, the resonant frequency can be changed according to change in thickness of the piezoelectric thin film. It is conceived that the FBAR can support frequencies of the order of several GHz.

As shown in FIGS. 10A and 10B, the related-art thin-film piezoelectric resonator has a so-called coplanar structure which includes a substrate 1, upper and lower barrier layers 2 and 3 formed on upper and lower surfaces of the substrate 1 respectively, a lower electrode 4 formed on the upper barrier layer 2, a piezoelectric thin film 5 formed on the lower electrode 4, and an upper electrode 6 and ground electrodes 7 formed on the piezoelectric thin film 5. Incidentally, the substrate 1 includes a vibration space S.

K. Nakamura and H. Kobayashi "Thin Film Resonators and Filters", International Symposium on Acoustic Wave Devices for Future Mobile Communication Systems, Mar. 5, 2001, pp. 93–99 proposes another type of the thin-film piezoelectric resonator. In that, an acoustic multi-layer film is formed without provision of any vibration space in the substrate. That is, this type of the thin-film piezoelectric resonator includes a substrate, an acoustic multi-layer film having a plurality of layers disposed on the substrate, a lower electrode disposed on the acoustic multi-layer film, a piezoelectric thin film disposed on the lower electrode, and an upper electrode disposed on the piezoelectric thin film. For example, the acoustic multi-layer film is formed by laminating layers of high acoustic impedance material such as aluminum nitride and layers of low acoustic impedance material such as silicon oxide.

In a further type of the thin-film piezoelectric resonator, a cavity is provided between the substrate and the lower electrode (JP-A-60-189307). That is, this type of the thin-film piezoelectric resonator includes a substrate, a lower electrode formed on the substrate so as to form a cavity between the substrate and the lower electrode, a piezoelectric thin film disposed on the lower electrode, and an upper electrode disposed on the piezoelectric thin film.

In each of these types of the thin-film piezoelectric resonators, a metal such as Al, Pt, Au, Ag, Cr, Cu, Ti, etc. can be used as an electrode material for forming the upper and lower electrodes which are provided on opposite surfaces of the piezoelectric thin film respectively.

Each electrode has a portion concerning a resonant portion, and a lead-out portion. The resonant portion is defined as a portion where the piezoelectric thin film is sandwiched between the lower electrode and the upper electrode, and the lead-out portion is defined as a portion except for the resonant portion. Generally, these portions are integrally formed by a thin-film forming method. Because the thickness of the resonant portion inclusive of the electrode portion is decided on the basis of a required frequency, the total thickness of the electrode inclusive of the lead-out portion is decided necessarily.

Further, international publication WO99/37023 discloses a film bulk acoustic wave device, comprising: a substrate; a bottom electrode formed on one surface of the substrate; a piezoelectric film formed on the bottom electrode; and a first top electrode formed on the piezoelectric film, further comprises a second top electrode having a larger mass load than the first top electrode, and formed on the first top electrode on the piezoelectric film when viewed from the center of the first top electrode, wherein the piezoelectric film has a high-band-cut-off-type dispersion characteristic. The cut-off frequency of a second top electrode portion piezoelectric film having a large mass load can be lower than the cut-off frequency of a first top electrode portion piezoelectric film, to thereby trap the energy of the acoustic wave in a region of the first top electrode portion side, so that good performance may be feasible The thickness of each electrode is limited by the resonant frequency. For this reason, when each electrode is too thin, there is a possibility that electric loss may occur. Incidentally, the resonant characteristic of the thin-film piezoelectric resonator is obtained by using a thickness vibration mode of the piezoelectric thin film. Ripples due to a thickness shear mode may occur on a pass signal in the passband according to the electrode material and structure of the resonant portion.

SUMMARY OF THE INVENTION

Therefore, a first feature of the invention is to provide a thin-film piezoelectric resonator, a filter and a duplexer with a insertion loss, and a method for fabricating the thin-film piezoelectric resonator, the filter and the dupluxer.

A second feature of the invention is to provide a thin-film piezoelectric resonator, a filter and a dupluxer with small ripples, and a method for fabricating the thin-film piezoelectric resonator, the filter and the dupluxer.

According to first aspect of the invention, it is provided a thin-film piezoelectric resonator including a piezoelectric thin film having piezoelectric characteristic, and an upper electrode and a lower electrode arranged on opposite surfaces of the piezoelectric thin film for applying an excitation voltage to the piezoelectric thin film, wherein: each of the upper electrode and the lower electrode includes a resonant portion, and a lead-out portion; and the electrode thickness of at least one part of the lead-out portion in at least one of the upper electrode and the lower electrode is larger than the electrode thickness of the resonant portion formed to be continued from the lead-out portion.

According to second aspect of the invention, it is provided a thin-film piezoelectric resonator including a piezoelectric thin film having piezoelectric characteristic, an upper electrode and a lower electrode arranged on opposite surfaces of the piezoelectric thin film for applying an excitation voltage to the piezoelectric thin film, and ground electrodes arranged on the same plane with at least one of the upper electrode and the lower electrode, wherein: each of the upper electrode and the lower electrode includes a resonant portion, and a lead-out portion; and the electrode thickness of at least one part of each of the ground electrodes is larger than the electrode thickness of the resonant portion in the upper electrode or the lower electrode formed on the same plane with the ground electrodes.

According to third aspect of the invention, it is provided a thin-film piezoelectric resonator including a piezoelectric thin film having piezoelectric characteristic, and an upper electrode and a lower electrode arranged on opposite surfaces of the piezoelectric thin film for applying an excitation voltage to the piezoelectric thin film, wherein: each of the upper electrode and the lower electrode includes a resonant portion, and a lead-out portion; and the lead-out portion in at least one of the upper electrode and the lower electrode is different in electrode material from the resonant portion formed to be continued from the lead-out portion.

Preferably, in the thin-film piezoelectric resonator as discussed above, at least one part of the lead-out portion is formed by stacking layers with different electrode materials, where one of the stacked layers is continued from the resonant portion.

Preferably, in the thin-film piezoelectric resonator as discussed above, the piezoelectric thin film has a thickness of not larger than 5 µm.

It is provided a filter having thin-film piezoelectric resonators as discussed above.

It is provided a duplexer having thin-film piezoelectric resonators as discussed above.

According to fourth aspect of the invention, it is provided a method of fabricating a thin-film piezoelectric resonator including a piezoelectric thin film having piezoelectric characteristic, and an upper electrode and a lower electrode arranged on opposite surfaces of the piezoelectric thin film for applying an excitation voltage to the piezoelectric thin film, the method including the step of forming the upper electrode and the lower electrode, at least one of the forming steps of the upper electrode and the lower electrode including at least two film-forming and patterning processes, wherein a mask used in the first patterning process is different in shape from a mask used in the second patterning process or in the patterning process after the second patterning process.

DETAILED DESCRIPTION OF THE PREFERRED EMBODIMENTS

A specific configuration of the invention will be described below in detail.

Figure 1A:
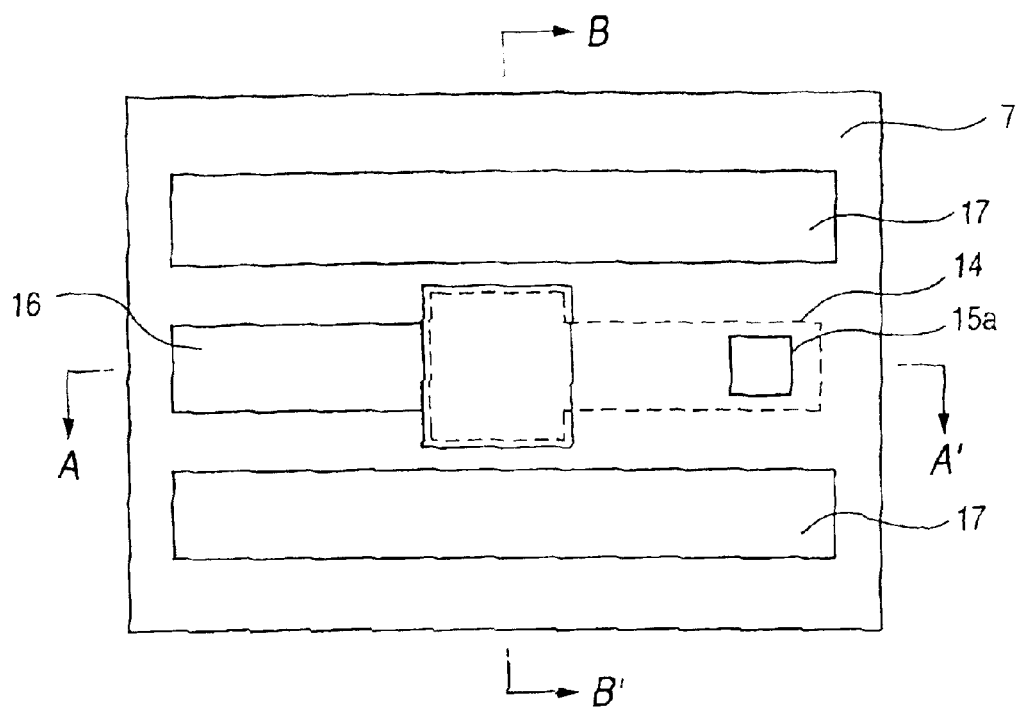
FIG. 1A is a plan view showing a thin-film piezoelectric resonator according to a first embodiment of the invention.
Figure 1B:
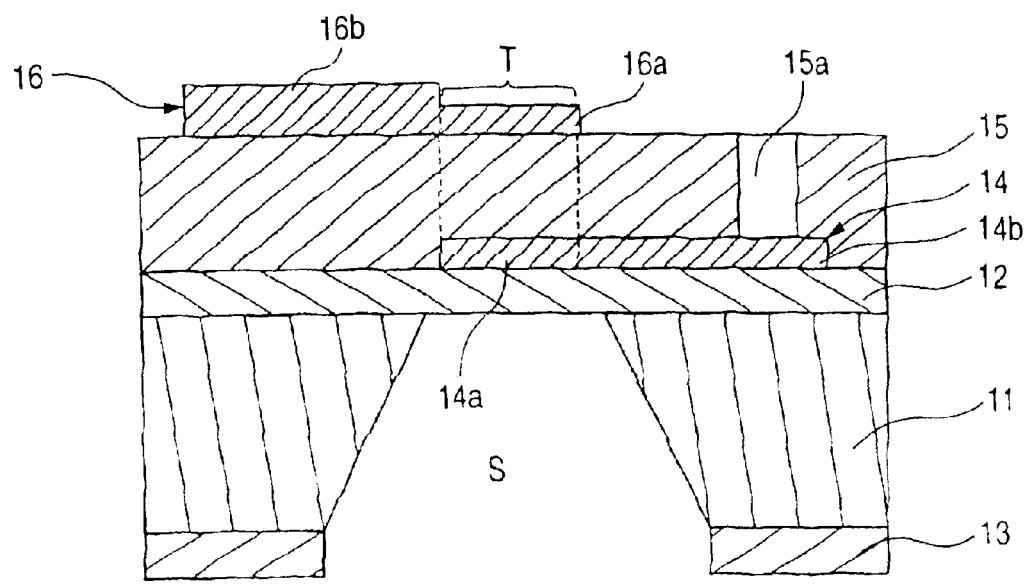
FIG. 1B is a sectional view taken along the line A–A' in FIG. 1A.
Figure 1C:
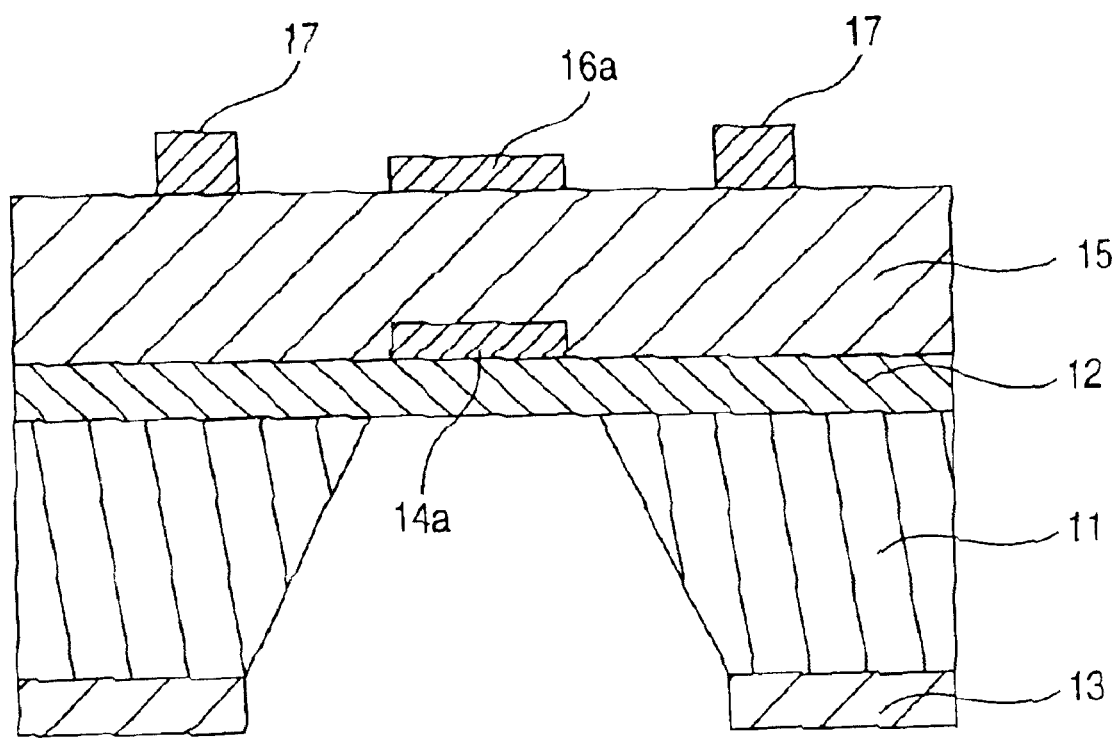
FIG. 1C is a sectional view taken along the line B–B' in FIG. 1A.

FIGS. 1A to 1C are schematic views showing a thin-film piezoelectric resonator according to a first embodiment of the invention. FIG. 1A is a plan view of the thin-film piezoelectric resonator. FIGS. 1B and 1C are sectional views taken along the line A–A' and the line B–B' in FIG. 1A.

The resonator according to this embodiment includes a substrate 11 having a vibration space S, and an upper barrier layer 12 and a lower barrier layer 13 provided on upper and lower surfaces of the substrate 11 respectively. The resonator further includes a lower electrode 14 provided on the upper barrier layer 12, a piezoelectric thin film 15 provided on the lower electrode 14, and an upper electrode 16 and ground electrodes 17 provided on the piezoelectric thin film 15. The lower electrode is electrically connected to a signal electrode through a through-hole 15a provided in the piezoelectric thin film to thereby form a resonator of a coplanar structure.

The upper electrode 16 and the lower electrode 14 have portions for resonating the upper electrode 16 and the lower electrode 14 (hereinafter referred to as resonant portions 16a and 14a respectively), and portions of the upper and lower electrodes 16 and 14 except the resonant portions 16a and 14a (hereinafter referred to as lead-out portions 16b and 14b respectively). Configuration is made so that the electrode thickness of at least one part of the lead-out portion 16b or 14b in at least one of the upper and lower electrodes 16 and 14 is larger than the electrode thickness of the resonant portion 16a or 14a formed to be continued from the lead-out portion. The term "formed to be continued" used herein means that the resonant portion and the lead-out portion are formed on the same plane and electrically connected to each other. That is, in FIGS. 1A and 1B, for example, the lead-out portion 16b and the resonant portion 16a in the upper electrode are formed continuously, and the lead-out portion 14b and the resonant portion 14a in the lower electrode are formed continuously.

In the coplanar structure in which the ground electrodes are provided, configuration may be made so that the electrode thickness of at least part of the ground electrodes is larger than the electrode thickness of the resonant portion of the upper or lower electrode formed on the same plane with the ground electrodes as shown in FIG. 1C.

Although FIGS. 1A and 1B show the case where the electrode thickness of all the lead-out portion 16b of the upper electrode 16 is made large, part of the lead-out portion 16b may be thickened. Alternatively, all or part of the ground electrodes 17 may be thickened. Or the electrode thickness of at least one of the upper electrode 16, the lower electrode 14 and the ground electrodes 17 may be made large. When part of the lead-out portion or the ground electrodes is thickened, for example, configuration may be made so that a neighborhood of an end portion of the lead-out portion is thickened so as to be provided as a pad for connecting an electrically connecting wire or the like.

Generally, the electrode thickness of each resonant portion is limited in order to obtain a required resonant frequency. Each of the lead-out portions and the ground electrodes, however, can have an arbitrary thickness because the lead-out portions and the ground electrodes have no relation to resonance. Accordingly, in order to reduce insertion loss affected by electric resistance of the electrodes, the electrode thickness of each of the lead-out portions of the upper and lower electrodes and the ground electrodes may be formed so as to be as large as possible to reduce electric resistance of these portions to thereby reduce insertion loss of the resonator.

The substrate 11 has a cavity S provided correspondingly to a region in which the resonator T is disposed. The cavity S is shaped like a rectangle in top view. For example, when an Si substrate is used as the substrate 11, the thickness of the substrate 11 is in a range of from about 100 $\mu$m to about 1000 $\mu$m.

The upper barrier layer 12 is an electrically insulating layer for separating the substrate 11 and the lower electrode 14 from each other so that the lower electrode 14 can be disposed in a region corresponding to the cavity S of the substrate 11. For example, silicon nitride ($SiN_x$), $SiO_2$ or the like may be used as the material of the upper barrier layer 12. The thickness of the upper barrier layer 12 is in a range of from about 0.03 $\mu$m to about 0.5 $\mu$m.

The lower barrier layer 13 is formed as a predetermined pattern for providing the cavity S. For example, silicon nitride ($SiN_x$), $SiO_2$ or the like may be used as the material of the lower barrier layer 13. The thickness of the lower barrier layer 13 is in a range of from about 0.03 $\mu$m to about 0.5 $\mu$m.

The piezoelectric thin film 15 is a thin film having piezoelectric characteristic. For example, zinc oxide (ZnO), lead zirconate titanate ($Pb(Zr,Ti)O_3$) (hereinafter referred to as PZT), aluminum nitride (AlN) or the like may be used as the material of the piezoelectric thin film 15. The thickness of the piezoelectric thin film 15 is preferably selected to be not larger than 5 $\mu$m. This is because the operating frequency is lowered if the piezoelectric thin film 15 is too thick.

Accordingly, it is preferable that the piezoelectric thin film 15 is formed to be as thin as possible so that the operating frequency shifts to the higher-frequency side. In consideration of the problem on fabrication, reliability, etc., the lower limit of the thickness is set at about 0.05 $\mu$m.

According to the material used for the piezoelectric thin film 15, for example, when PZT is used as the material of the piezoelectric thin film 15, a buffer layer (not shown) may be provided between the upper barrier layer and the lower electrode layer. For example, $SiO_2/TiO_2$, $ZrO_2$ or the like may be used as the material of the buffer layer. The thickness of the buffer layer may be selected to be in a range of from about 0.03 $\mu$m to about 0.5 $\mu$m.

A metal such as Al, Pt, Au, Ag, Cr, Cu, Ti, etc. may be used as the material of each of the lower and upper electrodes 14 and 16. Before each electrode is formed, an adhesive layer may be formed on the piezoelectric thin film from the point of view of improving adhesion between the electrode material and the piezoelectric thin film. For example, a chromium (Cr) layer may be formed as an adhesive layer and a gold (Au) layer may be laminated on the whole surface of the chromium layer so as to form a two-layered structure. In each of the lower and upper electrodes, the thickness of at least part of the lead-out portion is larger than the thickness of the resonant portion. The thickness of the resonant portion is decided on the frequency of the resonator and is generally in a range of from about 0.03 $\mu$m to about 1 $\mu$m. On the other hand, when the thickness of at least part of the lead-out portion is made large, the upper limit of the thickness is set at about 5 $\mu$m.

When the ground electrodes 17 are provided, for example, each ground electrode 17 is shaped like a rectangle long in one direction on the upper surface of the piezoelectric thin film but the shape of each ground electrode 17 is not limited thereto. When the ground electrodes 17 are provided so that at least part of the ground electrodes 17 is thicker than each resonant portion, the upper limit of the thickness of each ground electrode 17 is set at about 5 $\mu$m.

In FIGS. 1A and 1B, the resonant portion 14a provided in the neighborhood of the left end portion of the lower electrode 14 and the resonant portion 16a provided in the neighborhood of the right end portion of the upper electrode 16 are disposed opposite to each other through the piezoelectric thin film 15. These resonant portions 14a and 16a and the piezoelectric thin film 15 form the resonator T. Although FIG. 1A shows the case where the resonant portion 14a of the lower electrode 14 is slightly different in size from the resonant portion 16a of the upper electrode 16 for the sake of convenience, the size of the resonant portion 14a is practically equal to the size of the resonant portion 16a.

The piezoelectric thin film 15 has a through-hole 15a provided in a position corresponding to the neighborhood of an end of the lower electrode 14 opposite to the end portion where the resonant portion 14a is provided. The lower electrode 14 is connected to a signal conductor portion (not shown) by a bonding wire or the like (not shown) passing through the through-hole 15a.

Figure 2A:
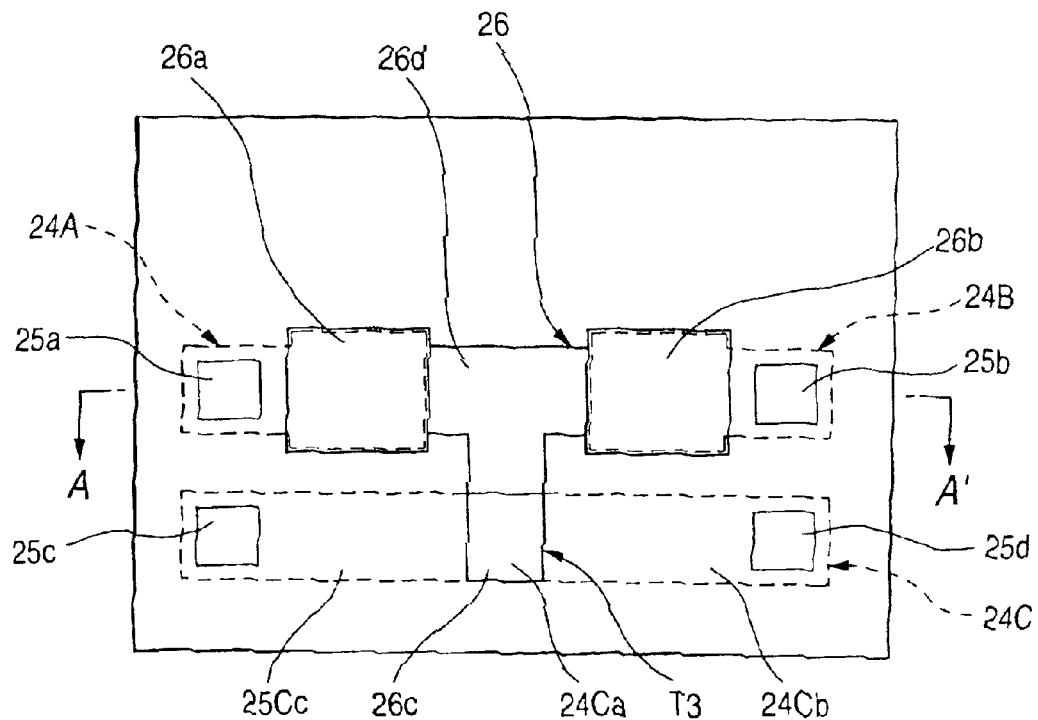
FIG. 2A is a plan view showing a filter according to a second embodiment of the invention.
Figure 2B:
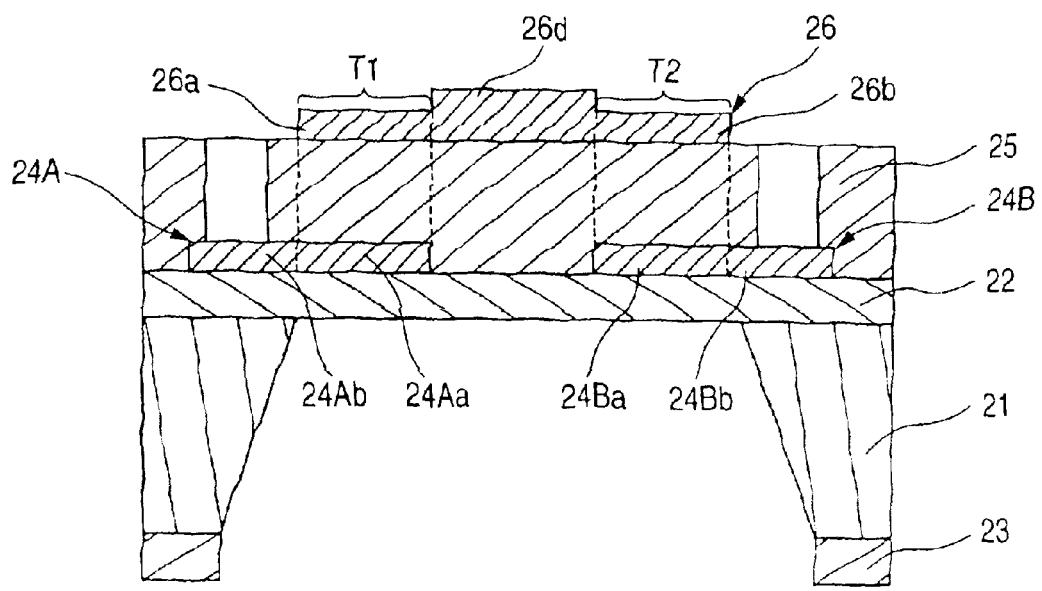
FIG. 2B is a sectional view taken along the line A–A' in FIG. 2A.
Figure 3:
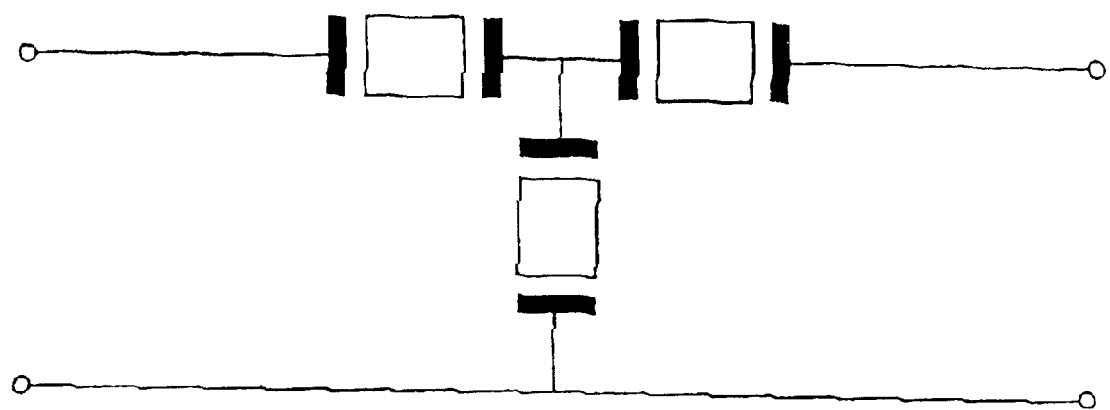
FIG. 3 is a circuit diagram showing the circuit configuration of the filter according to the second embodiment of the invention.

FIGS. 2A and 2B are schematic views showing a filter according to a second embodiment of the invention. FIG. 2A is a plan view of the filter. FIG. 2B is a sectional view taken along the line A–A' in FIG. 2A. The filter is formed as a ladder filter in which resonators are connected in series and in parallel as shown in FIG. 3.

The basic layer structure or the like is the same as in the first embodiment shown in FIGS. 1A and 1B. Although the description of duplicated parts will be omitted here, the structure of electrodes as a different structure will be described below.

Lower electrodes 24A and 24B are disposed left and right in FIGS. 2A and 2B. A lower electrode 24C is disposed below the lower electrodes 24A and 24B in FIG. 2A. Each of the lower electrodes 24A and 24B is substantially shaped like a rectangle in plan view so that the width of a neighborhood of an end portion of the lower electrode adjacent to an end portion of the other lower electrode is slightly larger than the width of the other portion. The lower electrode 24C is shaped like a rectangle long in one direction in plan view.

An upper electrode 26 is substantially shaped like a T figure in plan view. The upper electrode 26 has three resonant portions 26a, 26b and 26c in the neighborhoods of end portions of the T figure, and a lead-out portion 26d. The resonant portions 26a and 26b are slightly wider than the other portions.

The lower electrode 24A serves also as an input terminal of the filter. The lower electrode 24B serves also as an output terminal of the filter. The lower electrode 24C is grounded. The lower electrodes 24A, 24B and 24C have resonant portions 24Aa, 24Ba and 24Ca, and lead-out portions 24Ab, 24Bb, 24Cb and 24Cc respectively.

The filter according to this embodiment is formed so that the electrode thickness of at least part of the lead-out portion 26d, 24Ab, 24Bb, 24Cb or 24Cc in each of the upper electrode 26 and the lower electrodes 24A, 24B and 24C is larger than the electrode thickness of the resonant portion 26a, 26b, 26c, 24Aa, 24Ba or 24Ca formed to be continued from the lead-out portion.

Although FIGS. 2A and 2B show the case where the whole surface of the lead-out portion 26d of the upper electrode 26 is formed to be thicker than the resonant portions 26a, 26b and 26c of the upper electrode 26, part of the lead-out portion 26d may be formed to be thicker. All or part of at least one of the lead-out portions of the lower electrodes 24A, 24B and 24C may be thickened. At least one of the upper electrode 26 and the lower electrodes 24A, 24B and 24C may be thickened.

The resonant portion 24Aa provided in a neighborhood of the right end portion of the lower electrode 24A and the resonant portion 26a provided in a neighborhood of the left end portion of the upper electrode 26 are disposed opposite to each other through a piezoelectric thin film 25. These resonant portions 24Aa and 26a of the electrodes 24A and 26 and the piezoelectric thin film 25 form a series resonator T1 on the input terminal side of the filter.

The resonant portion 24Ba provided in a neighborhood of the left end portion of the lower electrode 24B and the resonant portion 26b provided in a neighborhood of the right end portion of the upper electrode 26 are disposed opposite to each other through the piezoelectric thin film 25. These resonant portions 24Ba and 26b of the electrodes 24B and 26 and the piezoelectric thin film 25 form a series resonator T2 on the output terminal side of the filter. Although FIG. 2A shows the case where the resonant portions 24Aa and 24Ba of the lower electrodes 24A and 24B are different in size from the resonant portions 26a and 26b of the upper electrode 26 for the sake of convenience, the resonant portions 24Aa and 24Ba are practically equal in size to the resonant portions 26a and 26b.

The resonant portion 24Ca provided in a neighborhood of the center of the lower electrode 24C and the resonant portion 26c provided in a neighborhood of the lower end portion of the upper electrode 26 are disposed opposite to each other through the piezoelectric thin film 25. These resonant portions 24Ca and 26c of the electrodes 24C and 26 and the piezoelectric thin film 25 form a parallel resonator T3 in the filter.

The piezoelectric thin film 25 has through-holes 25a, 25b, 25c and 25d provided in positions corresponding to the neighborhoods of end portions of the lower electrodes 24A and 24B opposite to the end portions where the resonant portions 24Aa and 24Ba are provided and in positions corresponding to the neighborhoods of opposite end portions of the lower electrode 24C, respectively. The lower electrodes 24A and 24B are connected to signal conductor portions (not shown) by bonding wires or the like (not shown) passing through the through-holes 25a and 25b respectively. The lower electrode 24C is connected to a ground conductor portion (not shown) by bonding wires or the like (not shown) passing through the through-holes 25c and 25d.

Though not shown, the resonators according to this embodiment may be formed to function as a duplexer.

A method for fabricating the filter according to this embodiment will be described below with reference to FIGS. 2A and 2B. Incidentally, the resonator according to the embodiment shown in FIGS. 1A and 1B may be basically fabricated by the same fabricating method except difference in electrode structure.

First, silicon nitride ($SiN_x$) with a predetermined thickness is deposited by a chemical vapor deposition method on each of upper and lower surfaces of a bare Si wafer serving as the substrate 21. $SiN_x$ formed on the upper surface of the Si wafer forms the upper barrier layer 22. $SiN_x$ formed on the lower surface of the Si wafer is processed into a predetermined pattern by photolithography and reactive ion-etching to thereby form the lower barrier layer 23.

The lower electrodes 24A, 24B and 24C are formed by a so-called lift-off process according to the following procedure.

First, a predetermined pattern of photo resist is formed by photolithography. Then, metals as electrode materials, e.g. chromium and gold (Cu/Au) with predetermined thicknesses are deposited by sputtering. For example, a 10 nm-thick chromium layer and a 100 nm-thick gold layer are formed. Incidentally, Cr is used as an adhesive layer.

Then, the patterned photo resist and Cu/Au formed thereon are removed with a solvent such as acetone to thereby obtain the lower electrodes 24A, 24B and 24C.

Then, a piezoelectric material for forming the piezoelectric thin film 25, e.g., zinc oxide (ZnO) with a predetermined thickness is formed by sputtering. The piezoelectric thin film 25 is etched with acetic acid to form through-holes 25a, 25b, 25c and 25d for connecting bonding wires to the lower electrodes 24A, 24B and 24C respectively.

Figure 4:
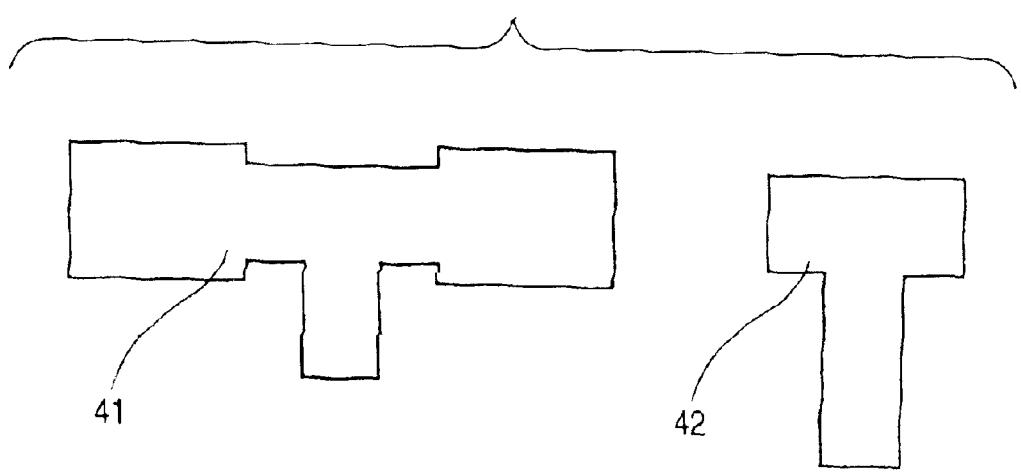
FIG. 4 is a view showing the shapes of masks used in a method for fabricating the filter according to the second embodiment of the invention.

Then, the upper electrode 26 is formed by a lift-off process. For example, after a mask 41 shown in FIG. 4 is used so that the electrode is formed by sputtering Cr/Au, a mask 42 shown in FIG. 4 is used so that a portion of overlap between the masks 41 and 42 in the electrode can be thickened by sputtering Cr/Au. In this manner, the shapes of masks can be selected so that a predetermined portion of the electrode is thickened.

Incidentally, when a thick connection portion 26d is to be formed in the upper electrode 26, it is generally necessary to repeat the lift-off process twice, so that there is a problem that the number of fabricating steps increases. For example, in a series-parallel-series type filter (ladder filter) as shown in FIG. 3, such a problem will be insignificant particularly.

That is, when the filter is to be formed, the frequency of each series resonator needs to differ from the frequency of the parallel resonator. When, for example, the electrode thicknesses of the resonant portions of the series and parallel resonators are made different to obtain different frequencies, the filter is however formed originally on the assumption that the lift-off process is repeated twice. Accordingly, in the ladder filter, when masks as shown in FIG. 4 are used, the electrodes can be partially thickened to reduce insertion loss without increase in number of steps.

Finally, the Si wafer is etched with a KOH solution from the lower barrier layer on the back. Thus, the filter is fabricated completely.

Although the description has been made on the case where the upper electrode is thickened, the lower electrodes may be thickened in the same electrode fabricating procedure as described above or the upper and lower electrodes may be thickened.

Figure 5A:
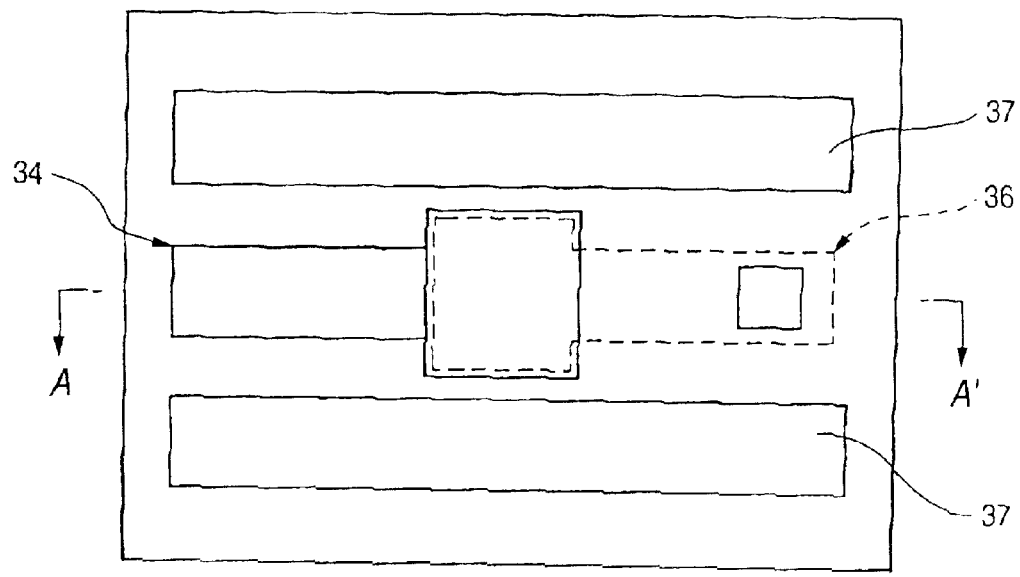
FIG. 5A is a plan view showing a thin-film piezoelectric resonator according to a third embodiment of the invention.
Figure 5B:
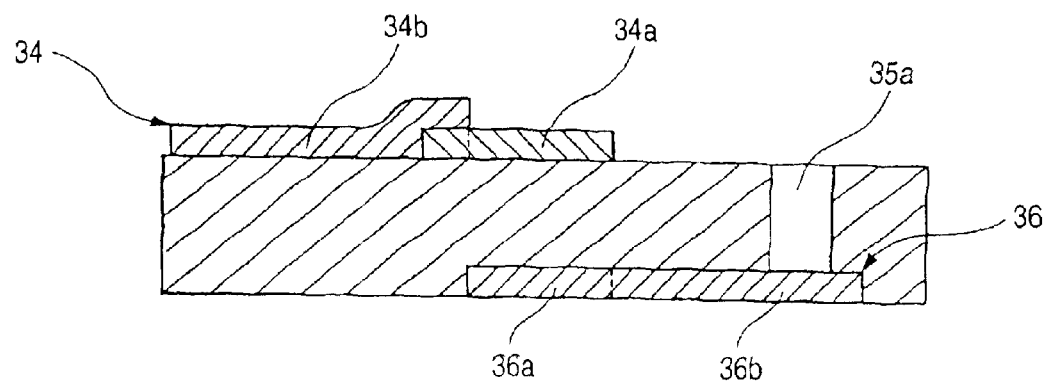
FIG. 5B is a sectional view taken along the line A–A' in FIG. 5A.

FIGS. 5A and 5B are schematic views showing a thin-film piezoelectric resonator according to a third embodiment of the invention. FIG. 5A is a plan view of the thin-film piezoelectric resonator. FIG. 5B is a sectional view taken along the line A–A' in FIG. 5A.

The basic layer structure or the like is the same as in the first embodiment shown in FIGS. 1A and 1B. The description of duplicated parts will be omitted. Other parts than an upper electrode, a lower electrode and ground electrodes are not shown in FIGS. 5A and 5B. The structure of electrodes as a different structure will be described below.

In the resonator according to this embodiment, at least one of the upper electrode 34 and the lower electrode 36 is formed so that the electrode material of the resonant portion 34a (36a) is different from the electrode material of the lead-out portion 34b (36b) formed to be continued from the resonant portion 34a (36a).

The resonant portion and the lead-out portion are connected to each other so as to partially overlap each other in the connection portion. That is, at least part of the lead-out portion 34b is formed by stacking an electrode material different from that of the resonant portion 34a, and one electrode of the stacked materials is continued from the resonant portion 34a. This is for the necessity of ensuring electric connection because insertion loss increases if electric connection in the connection portion is insufficient.

In a coplanar structure in which the ground electrodes are provided, configuration may be made so that the electrode material of the ground electrodes 37 is made different from the electrode material of the resonant portion 34a or 36a of the upper or lower electrode 34 or 36.

A material which is low both in Poisson's ratio and in density is preferably used as the electrode material of the resonant portions 34a and 36a. A material which is low in specific resistance is preferably used as the electrode material of the lead-out portions 34b and 36b or the ground electrodes 37. Specifically, aluminum (Al) is preferably used as the electrode material of the resonant portions whereas copper (Cu) or silver (Ag) is preferably used as the electrode material of the lead-out portions.

When a material which is low both in Poisson's ratio and in density is used as the electrode material of the resonant portions, ripples due to a thickness shear mode on the pass signal in the passband can be reduced. When a material which is low in specific resistance is used as the electrode material of the lead-out portions or the ground electrodes, insertion loss can be reduced.

Figure 6A:
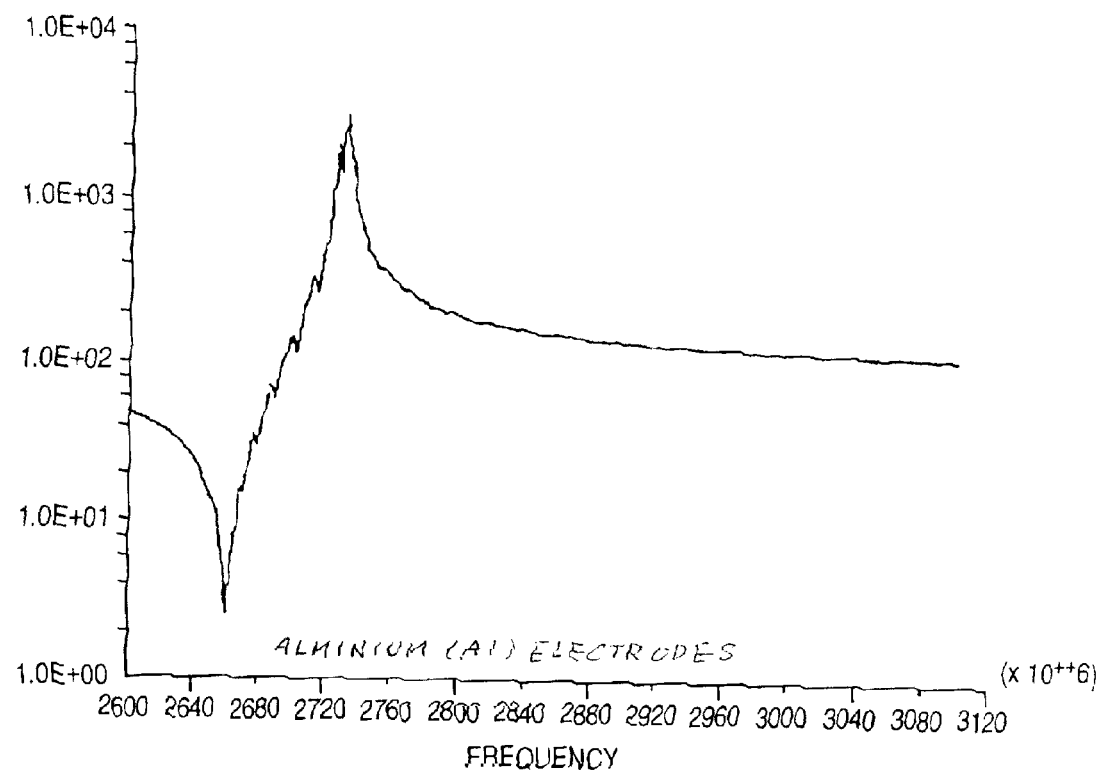
FIGS. 6A to 6C are graphs showing impedance-frequency characteristics in the case where the electrode material of each resonant portion in the third embodiment of the invention is changed, FIG. 6A showing the case where Al is used, FIG. 6B showing the case where Au is used, FIG. 6C showing the case where Ag is used.
Figure 6B:
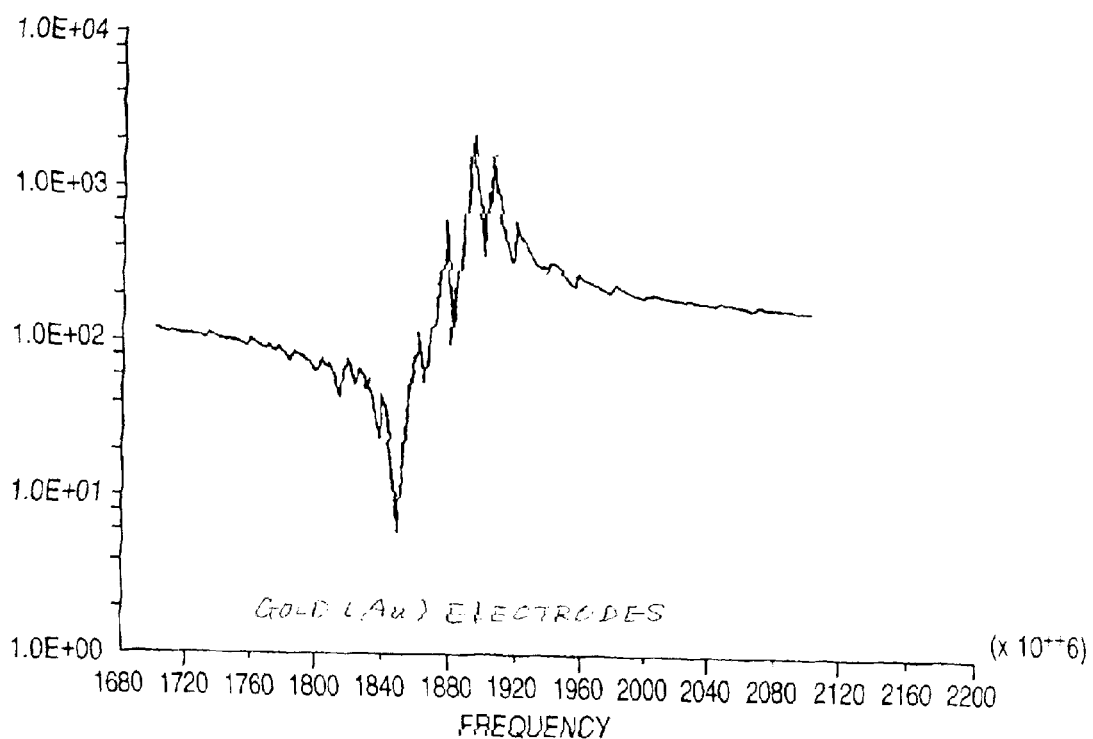
Figure 6C:
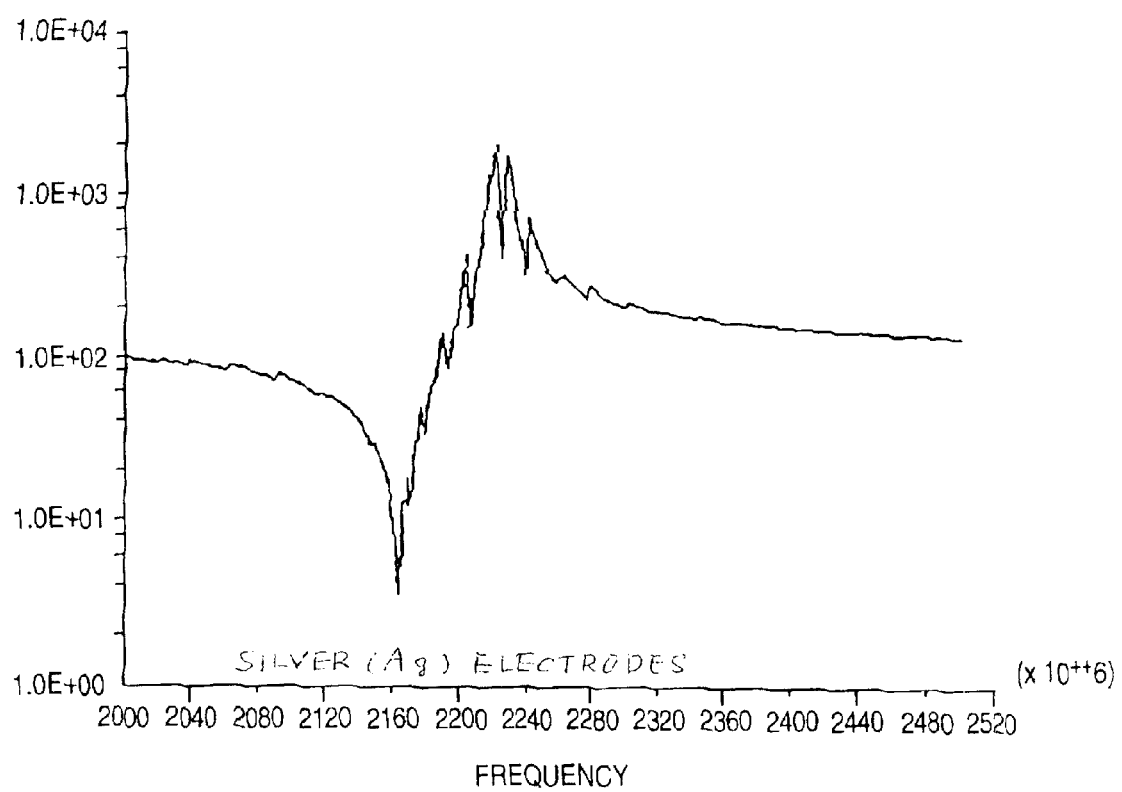

Table 1 shows characteristics of electrode materials. FIGS. 6A to 6C show impedance-frequency characteristics of electrode materials.

TABLE 1

| Metal Material | Poisson's Ratio | Density ($10^3$ kg · $m^{-3}$) | Specific Resistance ($10^{-8}$ Ω · m) |
|---|---|---|---|
| Al | 0.345 | 2.70 | 2.50 |
| Au | 0.440 | 19.32 | 2.05 |
| Pt | 0.377 | 21.45 | 9.81 |
| Cu | 0.343 | 6.24 | 1.55 |
| Ag | 0.367 | 10.50 | 1.47 |

The impedance-frequency characteristic shown in FIGS. 6A to 6C is measured for different electrode materials, in a thin-film piezoelectric resonator having a 0.1 μm-thick upper barrier layer ($SiN_x$), a 0.1 μm-thick lower electrode, a 1 μm-thick piezoelectric thin film (ZnO), and a 0.1 μm-thick upper electrode.

It is obvious from FIGS. 6A to 6C that ripples are minimized when Al which is low both in Poisson's ratio and in density is used as the electrode material.

Although the electrode thickness in each of the lower and upper electrodes need not be between the lead-out portion and the resonant portion formed to be continued from the lead-out portion, configuration may be preferably made so that the electrode thickness of at least part of the lead-out portion is larger than the electrode thickness of the resonant portion formed to be continued from the lead-out portion in the same manner as in the first embodiment of the invention. In a coplanar structure in which the ground electrodes are provided, configuration may be preferably made so that the electrode thickness of at least part of the ground electrodes is larger than the electrode thickness of the resonant portion of the upper or lower electrode formed on the same plane with the ground electrodes.

In the ladder filter as shown in FIG. 3, configuration may be made so that the electrode material of each resonant portion in at least one of the lower and upper electrodes is different from the electrode material of the lead-out portion formed to be continued from the resonant portion.

Though not shown, resonators according to this embodiment may be formed to function as a duplexer.

A method for producing the resonator according to the third embodiment of the invention will be described below with reference to FIGS. 5A and 5B.

First, silicon nitride ($SiN_x$) with a predetermined thickness is deposited by a chemical vapor deposition method on each of upper and lower surfaces of a bare Si wafer serving as the substrate. $SiN_x$ formed on the upper surface of the Si wafer forms the upper barrier layer. $SiN_x$ formed on the lower surface of the Si wafer is processed into a predetermined pattern by photolithography and reactive ion-etching to thereby form the lower barrier layer. (The layer structure is the same as in FIGS. 1A and 1B).

The lower electrode 36 is formed by a so-called lift-off process according to the following procedure.

First, a predetermined pattern of photo resist is formed by photolithography. Then, metals as electrode materials, e.g., chromium and gold (Cu/Au) with a thickness of 10 nm and a thickness of 100 nm respectively are deposited by sputtering. Incidentally, Cr is used as an adhesive layer.

Then, the patterned photo resist and Cu/Au formed thereon are removed with a solvent such as acetone to thereby obtain the lower electrode 36.

Then, a piezoelectric material for forming the piezoelectric thin film 35, e.g., zinc oxide (ZnO) with a predetermined thickness is formed by sputtering. The piezoelectric thin film is etched with acetic acid to form a through-hole 35a for connecting a bonding wire to the lower electrode 36.

Figure 7:
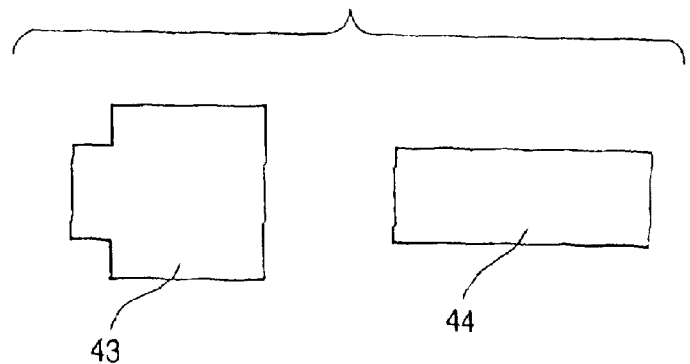
FIG. 7 is a view showing the shapes of masks used in a method for fabricating the thin-film piezoelectric resonator according to the third embodiment of the invention.

Then, the upper electrode 34 is formed by a lift-off process. For example, after a mask 43 shown in FIG. 7 is used so that the resonant portion 34a of the electrode is formed by sputtering Al, a mask 44 shown in FIG. 7 is used so that the lead-out portion 34b of the electrode is formed by sputtering Cr/Au. When the electrode material of the lower electrode is changed, the lift-off process may be repeated twice in the same manner as described above while the masks of predetermined shapes are used.

Finally, the Si wafer is etched with a KOH solution from the lower barrier layer on the back. Thus, the resonator is fabricated completely.

Figure 8:
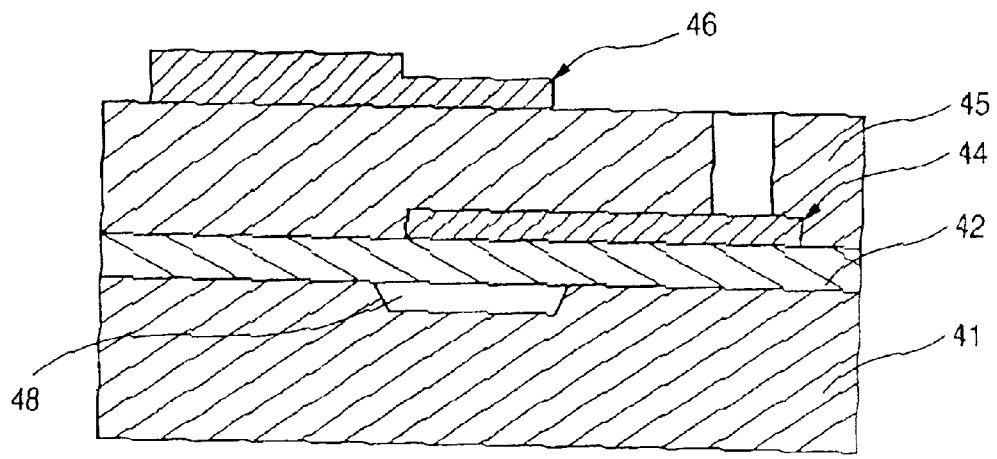
FIG. 8 is a schematic sectional view showing a thin-film piezoelectric resonator according to a fourth embodiment of the invention.

FIG. 8 is a schematic sectional view showing a thin-film piezoelectric resonator according to a fourth embodiment of the invention.

The basic layer structure or the like is the same as in the first embodiment shown in FIGS. 1A and 1B except that the vibration space is replaced by a cavity 48 provided between a lower barrier layer 42 and a substrate 41.

Incidentally, upper and lower electrodes 46 and 44 are provided on upper and lower surfaces of a piezoelectric thin film 45 respectively and configuration is made so that a lead-out portion of the upper electrode is thicker than a resonant portion of the upper electrode, in the same manner as in FIGS. 1A and 1B.

In at least one of the upper and lower electrodes, configuration may be made so that the electrode material of the resonant portion is different from the electrode material of the lead-out portion formed to be continued from the resonant portion, in the same manner as in the third embodiment.

Figure 9:
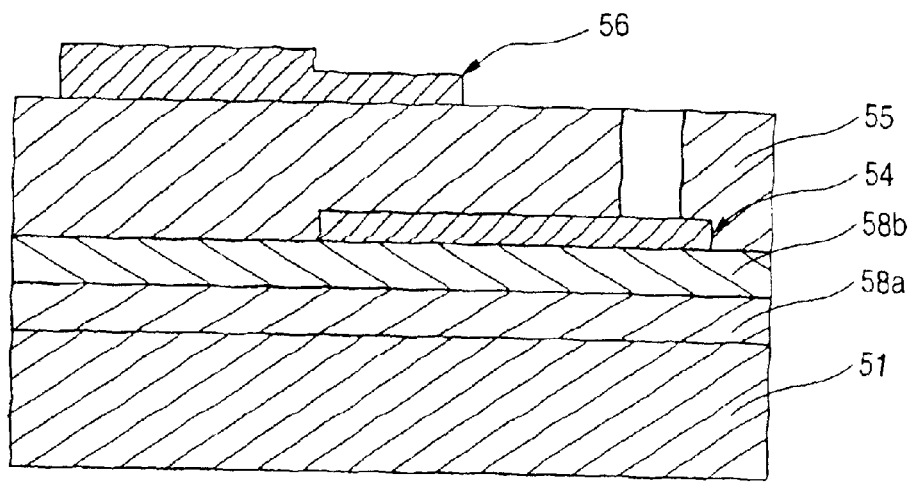
FIG. 9 is a schematic sectional view showing a thin-film piezoelectric resonator according to a fifth embodiment of the invention.
Figure 10A:
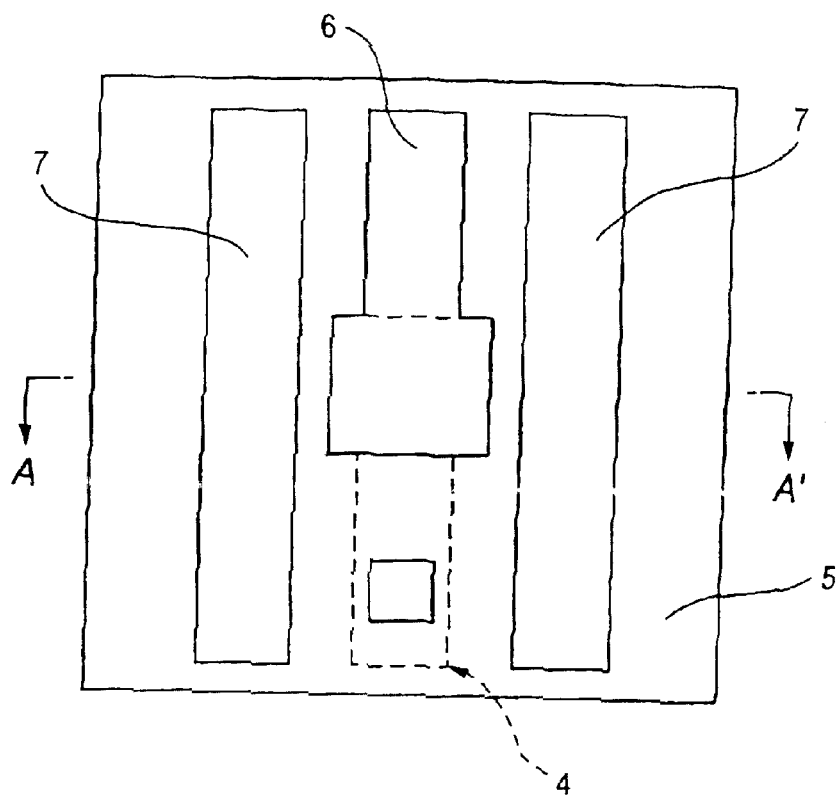
FIG. 10A is a plan view showing a thin-film piezoelectric resonator in the related art.
Figure 10B:
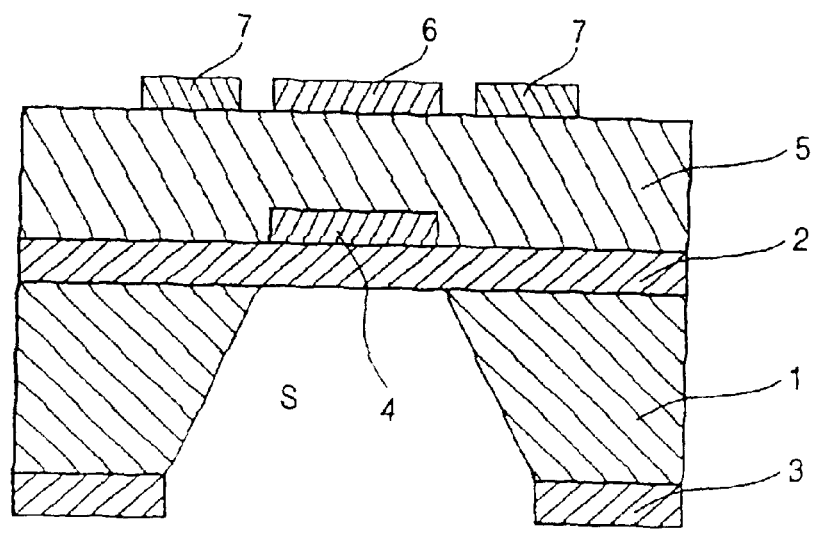
FIG. 10B is a sectional view taken along the line A–A' in FIG. 10A.

FIG. 9 is a schematic sectional view showing a thin-film piezoelectric resonator according to a fifth embodiment of the invention.

The basic layer structure or the like is the same as in the first embodiment shown in FIGS. 1A and 1B except that the vibration space is replaced by an acoustic multi-layer film of layers 58a and 58b provided between a lower electrode 54 and a substrate 51. The acoustic multi-layer film is formed by lamination of layers of a high acoustic impedance material such as aluminum nitride and layers of a low acoustic impedance material such as silicon oxide. Although FIG. 9 shows the case where the acoustic multi-layer film is composed of two layers 58a and 58b, the acoustic multi-layer film may be composed of three or more layers so that layers of a high acoustic impedance material and layers of a low acoustic impedance material are laminated alternately.

Incidentally, upper and lower electrodes 56 and 54 are provided on upper and lower surfaces of a piezoelectric thin film 55 respectively and configuration is made so that a lead-out portion of the upper electrode is thicker than a resonant portion of the upper electrode, in the same manner as in FIGS. 1A and 1B.

In at least one of the upper and lower electrodes, configuration may be made so that the electrode material of the resonant portion is different from the electrode material of the lead-out portion formed to be continued from the resonant portion, in the same manner as in the third embodiment.

In the thin-film piezoelectric resonator, the filter, the duplexer and the method for fabricating the thin-film piezoelectric resonator according to the invention, insertion loss can be reduced. In addition, ripples can be reduced.

What is claimed is:

1. A thin-film piezoelectric resonator comprising:
   a piezoelectric thin film having piezoelectric characteristic; and
   an upper electrode and a lower electrode arranged on opposite surfaces of said piezoelectric thin film for applying an excitation voltage to said piezoelectric thin film,
   wherein each of said upper electrode and said lower electrode includes a resonant portion and a lead-out portion, and
   an electrode thickness of at least one part of said lead-out portion in at least one of said upper electrode and said lower electrode is larger than an electrode thickness of said resonant portion formed to be continued from said lead-out portion.

2. A thin-film piezoelectric resonator according to claim 1, wherein said piezoelectric thin film has a thickness of not larger than 5 μm.

3. A thin-film piezoelectric resonator comprising:
   a piezoelectric thin film having piezoelectric characteristic; and
   an upper electrode and a lower electrode arranged on opposite surfaces of said piezoelectric thin film for applying an excitation voltage to said piezoelectric thin film,
   wherein each of said upper electrode and said lower electrode includes a resonant portion and a lead-out portion, and
   said lead-out portion in at least one of said upper electrode and said lower electrode is different in electrode material from said resonant portion formed to be continued from said lead-out portion.

4. A thin-film piezoelectric resonator according to claim 3, wherein at least one part of said lead-out portion is formed by stacking layers with different electrode materials, where one of said stacked electrode is formed to be continued from said resonant portion.

5. A method of fabricating a thin-film piezoelectric resonator including a piezoelectric thin film having piezoelectric characteristic, and an upper electrode and a lower electrode arranged on opposite surfaces of said piezoelectric thin film for applying an excitation voltage to said piezoelectric thin film, said method comprising the step of:
   forming said lower electrode and said upper electrode, at least one of forming step of said upper electrode and said lower electrode including at least two thin film-forming and patterning processes, wherein a mask used in the first patterning process is different in shape from a mask used in the second patterning process or in the patterning process after the second patterning process,
   said forming producing for at least one of the upper electrode and the lower electrode a resonant region and a lead-out portion extending from the resonant portion, said lead-out portion having an electrode thickness different from that of the resonant portion.

6. A filter including a thin-film piezoelectric resonator comprising:
   a piezoelectric thin film having piezoelectric characteristic; and
   an upper electrode and a lower electrode arranged on opposite surfaces of said piezoelectric thin film for applying an excitation voltage to said piezoelectric thin film,
   wherein each of said upper electrode and said lower electrode includes a resonant portion and a lead-out portion, and
   an electrode thickness of at least one part of said lead-out portion in at least one of said upper electrode and said lower electrode is larger than an electrode thickness of said resonant portion formed to be continued from said lead-out portion.

7. A duplexer including a thin-film piezoelectric resonator comprising:

a piezoelectric thin film having piezoelectric characteristic; and an upper electrode and a lower electrode arranged on opposite surfaces of said piezoelectric thin film for applying an excitation voltage to said piezoelectric thin film, wherein each of said upper electrode and said lower electrode includes a resonant portion and a lead-out portion, and an electrode thickness of at least one part of said lead-out portion in at least one of said upper electrode and said lower electrode is larger than an electrode thickness of said resonant portion formed to be continued from said lead-out portion.

* * * * *